US009399596B1

(12) United States Patent
Shi et al.

(10) Patent No.: US 9,399,596 B1
(45) Date of Patent: Jul. 26, 2016

(54) METHODS AND SYSTEMS FOR BONDING MULTIPLE WAFERS

(71) Applicant: Google Inc., Mountain View, CA (US)

(72) Inventors: Hongqin Shi, Mountain View, CA (US); Sandeep Giri, Mountain View, CA (US); Amir Torkaman, Mountain View, CA (US); Jamie Nam, Mountain View, CA (US)

(73) Assignee: Google Inc., Mountain View, CA (US)

( * ) Notice: Subject to any disclaimer, the term of this patent is extended or adjusted under 35 U.S.C. 154(b) by 264 days.

(21) Appl. No.: 14/105,257

(22) Filed: Dec. 13, 2013

(51) Int. Cl.
*H01L 21/00* (2006.01)
*H01L 25/00* (2006.01)
*C03C 27/10* (2006.01)

(52) U.S. Cl.
CPC ..................................... *C03C 27/10* (2013.01)

(58) Field of Classification Search
CPC ......... C03C 27/10; H01L 21/00; H01L 21/67; H01L 21/46; H01L 23/00; H01L 24/74; H01L 21/67005; H01L 21/67155; H01L 21/67161; H01L 21/67173; H01L 21/67178; H01L 21/673; H01L 21/67303; H01L 21/67313; H01L 21/67333; H01L 21/6734; H01L 21/67346; H01L 21/67379; H01L 21/67383; H01L 21/677; H01L 21/67712; H01L 21/67751; H01L 21/68–21/68792; H01L 24/00; H01L 25/00
See application file for complete search history.

(56) References Cited

U.S. PATENT DOCUMENTS

| | | | |
|---|---|---|---|
| 5,746,883 A | 5/1998 | Cha et al. | |
| 8,425,715 B2 | 4/2013 | George | |
| 2008/0164606 A1 | 7/2008 | Greisen | |
| 2009/0205783 A1* | 8/2009 | Tanabe | C30B 25/14 156/345.37 |
| 2010/0126962 A1* | 5/2010 | Lee | H01L 21/6875 216/58 |
| 2012/0193808 A1 | 8/2012 | Zou et al. | |
| 2013/0058202 A1* | 3/2013 | Chou | C25D 5/505 369/126 |

* cited by examiner

*Primary Examiner* — Michael N Orlando
*Assistant Examiner* — Matthew Hoover
(74) *Attorney, Agent, or Firm* — McDonnell Boehnen Hulbert & Berghoff LLP

(57) ABSTRACT

The present disclosure provides methods and systems for bonding multiple wafers. An example system may include a sealable chamber with a first and second substantially vertical post positioned inside of the sealable chamber. The system may also include a first latch connected to the first post via a first pin, wherein the first pin allows the first latch to rotate about the first pin. The system may also include a second latch similarly configured to the first latch. The system may also include a base plate positioned between the first and second posts. The base plate is arranged such that when a first wafer rests on the base plate and a second wafer rests on the first and second latches, moving the base plate from a first position to a second position causes a top surface of the first wafer to contact a bottom surface of the second wafer.

11 Claims, 16 Drawing Sheets

METHODS AND SYSTEMS FOR BONDING MULTIPLE WAFERS

BACKGROUND

Unless otherwise indicated herein, the materials described in this section are not prior art to the claims in this application and are not admitted to be prior art by inclusion in this section.

Computing devices such as personal computers, laptop computers, tablet computers, cellular phones, and countless types of Internet-capable devices are increasingly prevalent in numerous aspects of modern life. Over time, the manner in which these devices are providing information to users is becoming more intelligent, more efficient, more intuitive, and/or less obtrusive.

The trend toward miniaturization of computing hardware, peripherals, as well as of sensors, detectors, and image and audio processors, among other technologies, has helped open up a field sometimes referred to as "wearable computing." In the area of image and visual processing and production, in particular, it has become possible to consider wearable displays that place a graphic display close enough to a wearer's (or user's) eye(s) such that the displayed image appears as a normal-sized image, such as might be displayed on a traditional image display device. The relevant technology may be referred to as "near-eye displays."

Wearable computing devices with near-eye displays may also be referred to as "head-mountable displays" (HMDs), "head-mounted displays," "head-mounted devices," or "head-mountable devices." A head-mountable display places a graphic display or displays close to one or both eyes of a wearer. To generate the images on a display, a computer processing system may be used. Such displays may occupy a wearer's entire field of view, or only occupy part of wearer's field of view. Further, head-mounted displays may vary in size, taking a smaller form such as a glasses-style display or a larger form such as a helmet, for example.

Emerging and anticipated uses of wearable displays include applications in which users interact in real time with an augmented or virtual reality. Such applications can be mission-critical or safety-critical, such as in a public safety or aviation setting. The applications can also be recreational, such as interactive gaming. Many other applications are also possible.

SUMMARY

Example systems and methods for bonding multiple wafers are disclosed. An example system may include one or more sets of latches configured to hold one or more wafers. The one or more sets of latches may be located within a sealable chamber. The top surfaces of the wafers may be coated with an adhesive and subsequently loaded onto the latches. Once loaded onto the latches, a base plate may be configured to slowly move up to contact the bottom surface of a first wafer positioned on a first set of latches. The base plate may then lift the first wafer up until it contacts the second set of latches. The latches may be configured to rotate about pins located at one end of the latches. The latches may rest on a stopper to prevent the latches from rotating downward and maintain a level top surface of the latches. When the base plate lifts the first wafer into the second set of latches, the laches rotate, thereby allowing the top surface of the first wafer to contact and bond with the bottom surface of the second wafer that is positioned on the second set of latches. Additional wafers and corresponding sets of latches may be added to allow for bonding of additional wafers to create a stack of bonded wafers.

In one embodiment, the present disclosure provides a system including a sealable chamber and a first and second substantially vertical post positioned inside of the sealable chamber. The system may also include a first stopper fixed to the first post and a second stopper fixed to the second post. The system may also include a first latch connected to the first post via a first pin, wherein the first pin allows the first latch to rotate about the first pin. The system may also include a second latch connected to the second post via a second pin, wherein the second pin allows the second latch to rotate about the second pin. The system may also include a base plate positioned between the first and second posts, wherein the base plate is configured to move upwards from a first position below the first and second latches to a second position above the first and second latches, and wherein the base plate is arranged such that when a first wafer rests on the base plate and a second wafer rests on the first and second latches, moving the base plate from the first position to the second position causes a top surface of the first wafer to contact a bottom surface of the second wafer.

In another embodiment, the present disclosure provides a method. The method may include creating a vacuum inside of a sealable chamber. A first wafer may be positioned on a base plate inside of the sealable chamber, and a second wafer may be positioned on a first set of latches inside of the sealable chamber. An adhesive may be applied to at least a top surface of the first wafer. The method may also include raising the base plate so that the first wafer contacts the first set of latches, wherein the first set of latches are configured to rotate or retract to allow the top surface of the first wafer to contact a bottom surface of the second wafer such that the first wafer is bonded to the second wafer via the adhesive on the surface of the top surface of the first wafer.

In another embodiment, the present disclosure provides another method. The method may include raising a base plate inside of a sealable chamber so that a first wafer positioned on the base plate contacts a set of latches, wherein the set of latches are configured to rotate or retract to allow the first wafer to rise above the set of latches. The method may also include lowering the base plate so that the first wafer rests on a top surface of the set of latches. The method may also include creating a vacuum inside of the sealable chamber, wherein a second wafer is positioned on the base plate, and wherein an adhesive is applied to a top surface of the second wafer. The method may also include raising the base plate so that the second wafer contacts the set of latches, wherein the set of latches are configured to rotate or retract to allow the second wafer to contact the first wafer such that the first wafer is bonded to the second wafer via the adhesive on the top surface of the second wafer.

In yet another embodiment, a system may include a means creating a vacuum inside of the sealable chamber, wherein a first wafer is positioned on a base plate inside of the sealable chamber, wherein a second wafer is positioned on a first set of latches inside of the sealable chamber, and wherein an adhesive is applied to at least a top surface of the first wafer. The system may also include a means for raising the base plate so that the first wafer contacts the first set of latches, wherein the first set of latches are configured to rotate or retract to allow the top surface first wafer to contact a bottom surface of the second wafer such that the first wafer is bonded to the second wafer via the adhesive on the surface of the top surface of the first wafer.

These as well as other aspects, advantages, and alternatives will become apparent to those of ordinary skill in the art by reading the following detailed description, with reference where appropriate to the accompanying drawings.

DETAILED DESCRIPTION

Figure 1A:
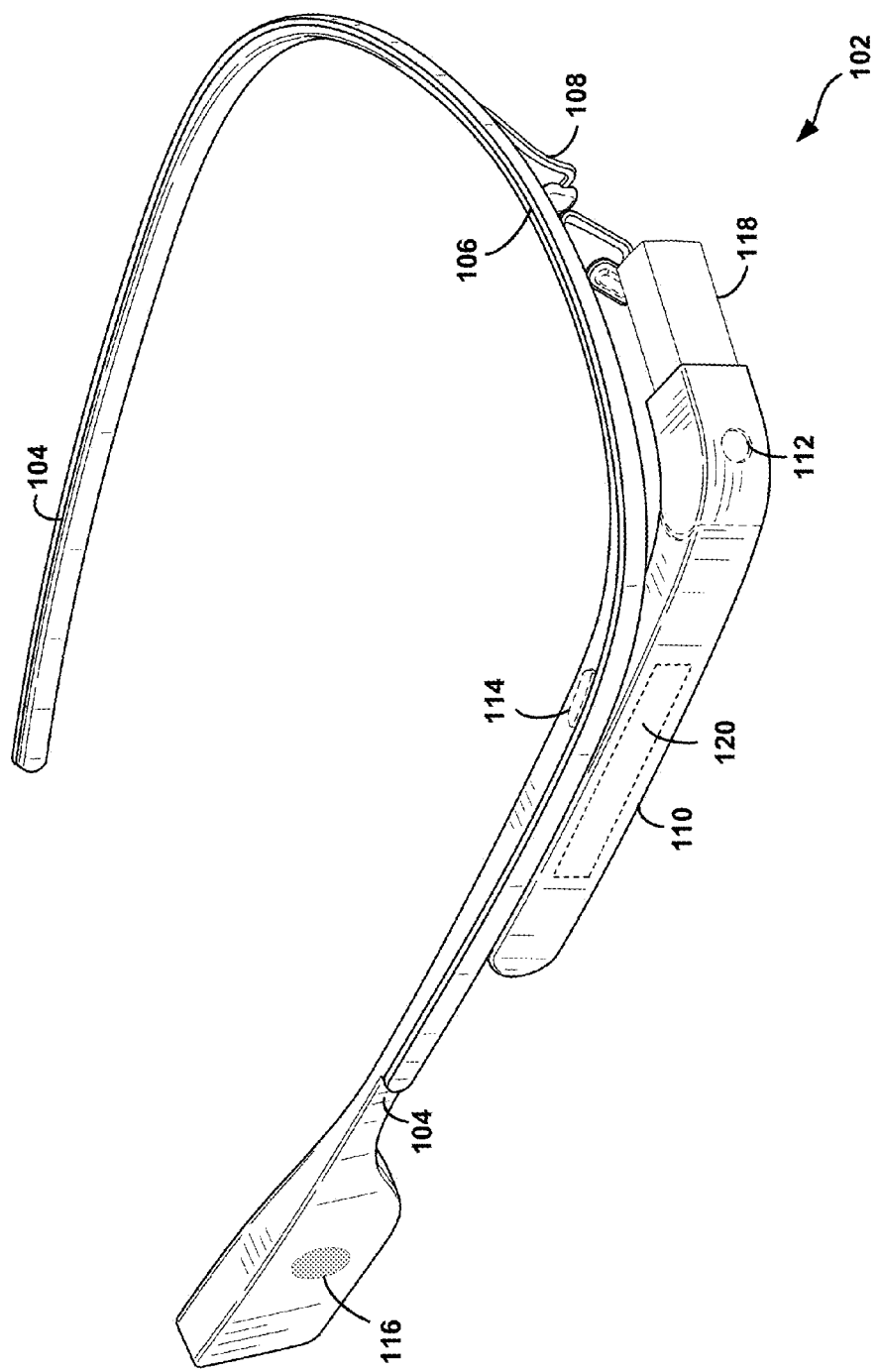
FIG. 1A illustrates a wearable computing system according to an example embodiment.

Example methods and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. In the following detailed description, reference is made to the accompanying figures, which form a part thereof. In the figures, similar symbols typically identify similar components, unless context dictates otherwise. Other embodiments may be utilized, and other changes may be made, without departing from the spirit or scope of the subject matter presented herein.

The example embodiments described herein are not meant to be limiting. It will be readily understood that the aspects of the present disclosure, as generally described herein, and illustrated in the figures, can be arranged, substituted, combined, separated, and designed in a wide variety of different configurations, all of which are explicitly contemplated herein.

I. OVERVIEW

Wearable systems can integrate various elements, such as miniaturized computers, input devices, sensors, detectors, image displays, wireless communication devices as well as image and audio processors, into a device that can be worn by a user. Such devices provide a mobile and lightweight solution to communicating, computing and interacting with one's environment. With the advance of technologies associated with wearable systems and miniaturized optical elements, it has become possible to consider wearable compact optical displays that augment the wearer's experience of the real world.

By placing an image display element close to the wearer's eye(s), an artificial image can be made to overlay the wearer's view of the real world. Such image display elements are incorporated into systems also referred to as "near-eye displays", "head-mounted displays" or "heads-up displays" (HUDs). Depending upon the size of the display element and the distance to the wearer's eye, the artificial image may fill or nearly fill the wearer's field of view.

A head-mountable device (HMD) may include side-arms, a center frame support, and a bridge portion with nosepiece. The HMD may additionally include a component housing, which may include an on-board computing system, an image capture device, and a button for operating the image capture device (and/or usable for other purposes). The HMD may further include a display, which may be coupled to one of the side-arms via the component housing. In an example embodiment, the display may be a see-through display, which is made of glass and/or another transparent or translucent material, such that the wearer can see their environment through the display. The display may be arranged such that when the HMD is worn, the display is positioned in front of or proximate to a user's eye when the HMD is worn by a user. The display may include several glass plates that are bonded together to form a stack. These glass plates may be aligned at an angle to maximize the usage of the display. Therefore, a device to assist in bonding multiple glass plates or, more generally, to assist in bonding wafers, may be desirable.

An example system may include one or more sets of latches configured to hold one or more wafers. The one or more sets of latches may be located within a sealable chamber. The top surfaces of the wafers may be coated with an adhesive and subsequently loaded onto the latches. Once loaded onto the latches, a base plate may be configured to slowly move up to contact the bottom surface of a first wafer positioned on a first set of latches. The base plate may then lift the first wafer up until it contacts the second set of latches. The latches may be configured to rotate about pins located at one end of the latches. The latches may rest on a stopper to prevent the latches from rotating downward and maintain a level top surface of the latches. When the base plate lifts the first wafer into the second set of latches, the laches rotate, thereby allowing the top surface of the first wafer to contact and bond with the bottom surface of the second wafer that is positioned on the second set of latches. In another example, when the base plate lifts the first wafer into the second set of latches, the latches may be configured to retract to allow the top surface of the first wafer to contact and bond with the bottom surface of the second wafer. Additional wafers and corresponding sets of latches may be added to allow for bonding of additional wafers to create a stack of bonded wafers.

It should be understood that the above examples are provided for illustrative purposes, and should not be construed as limiting. Further, the system and corresponding methods described herein are not limited to bonding wafers for HMD displays, and may be applied in any application for bonding multiple wafers. As such, the system may additionally or alternatively includes other features or includes fewer features, without departing from the scope of the invention.

II. EXAMPLE WEARABLE COMPUTING DEVICES

Systems and devices in which example embodiments may be implemented will now be described in greater detail. In general, an example system may be implemented in or may take the form of a wearable computer (also referred to as a wearable computing device). In an example embodiment, a wearable computer takes the form of or includes a head-mountable device (HMD).

An example system may also be implemented in or take the form of other devices that support speech commands, such as a mobile phone, tablet computer, laptop computer, or desktop computer, among other possibilities. Further, an example system may take the form of non-transitory computer readable medium, which has program instructions stored thereon that are executable by at a processor to provide the functionality described herein. An example system may also take the form of a device such as a wearable computer or mobile phone, or a subsystem of such a device, which includes such a non-transitory computer readable medium having such program instructions stored thereon.

An HMD may generally be any display device that is capable of being worn on the head and places a display in front of one or both eyes of the wearer. An HMD may take various forms such as a helmet or eyeglasses. As such, references to "eyeglasses" or a "glasses-style" HMD should be understood to refer to an HMD that has a glasses-like frame so that it can be worn on the head. Further, example embodiments may be implemented by or in association with an HMD with a single display or with two displays, which may be referred to as a "monocular" HMD or a "binocular" HMD, respectively.

FIG. 1A illustrates a wearable computing system according to an example embodiment, which takes the form of a monocular HMD 102. The HMD 102 may include side-arms 104, a center frame support 106, and a bridge portion with nosepiece 108. In the example shown in FIG. 1A, the center frame support 106 connects the side-arms 104. The HMD 102 does not include lens-frames containing lens elements. The HMD 102 may additionally include a component housing 110, which may include an on-board computing system (not shown), an image capture device 112, and a button 114 for operating the image capture device 112 (and/or usable for other purposes). Component housing 110 may also include other electrical components and/or may be electrically connected to electrical components at other locations within or on the HMD. HMD 102 also includes a BCT 116.

The HMD 102 may include a single display 118, which may be coupled to one of the side-arms 104 via the component housing 110. In an example embodiment, the display 118 may be a see-through display, which is made of glass and/or another transparent or translucent material, such that the wearer can see their environment through the display 118. Further, the component housing 110 may include the light sources (not shown) for the display 118 and/or optical elements (not shown) to direct light from the light sources to the display 118. As such, display 118 may include optical features that direct light that is generated by such light sources towards the wearer's eye, when HMD 102 is being worn.

In a further aspect, HMD 102 may include a sliding feature 120, which may be used to adjust the length of the side-arms 104. Thus, sliding feature 120 may be used to adjust the fit of HMD 102. Further, an HMD may include other features that allow a wearer to adjust the fit of the HMD, without departing from the scope of the invention.

Figure 1B:
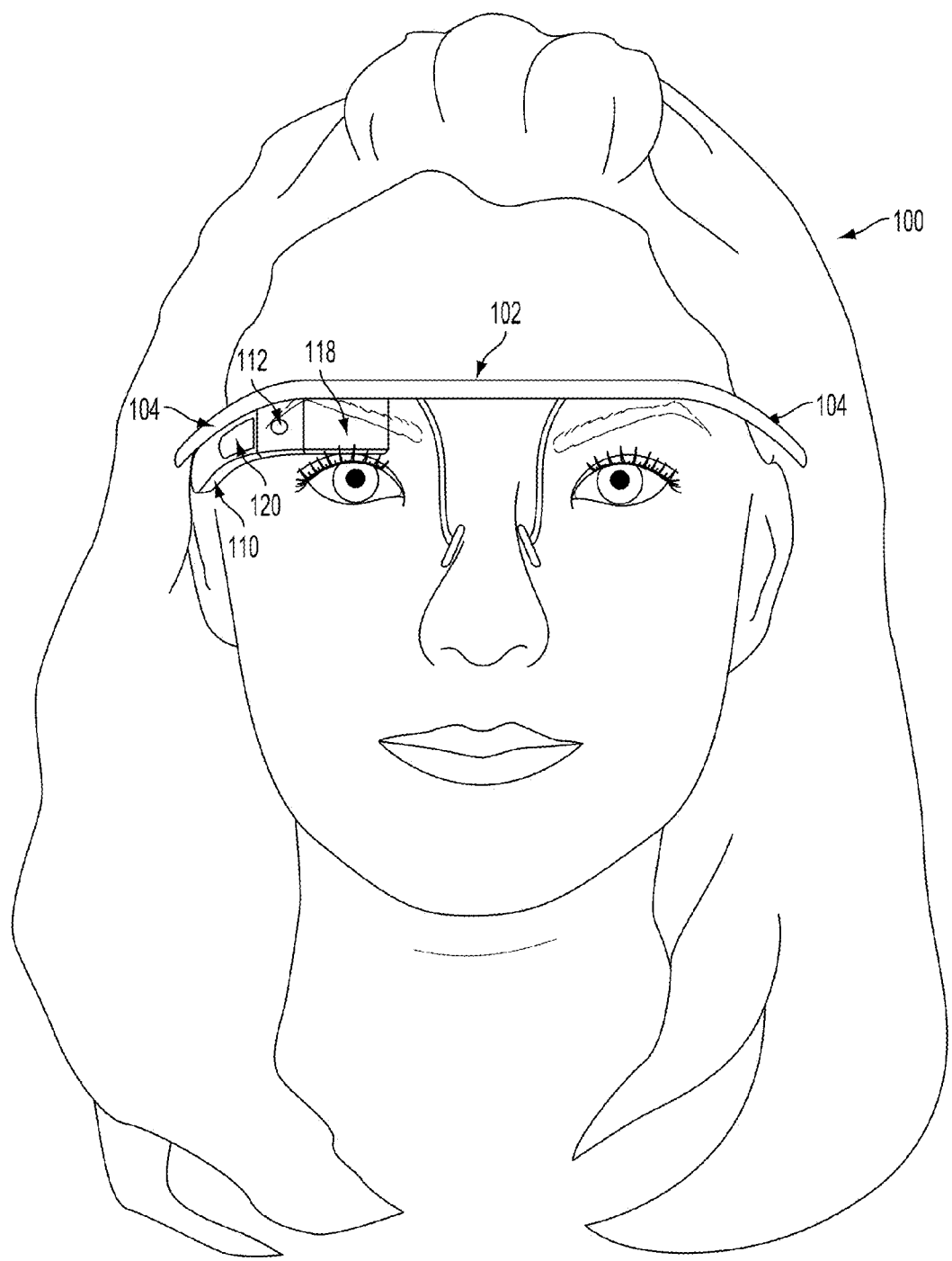
FIGS. 1B to 1D are simplified illustrations of the wearable computing system shown in FIG. 1A, being worn by a wearer.
Figure 1C:
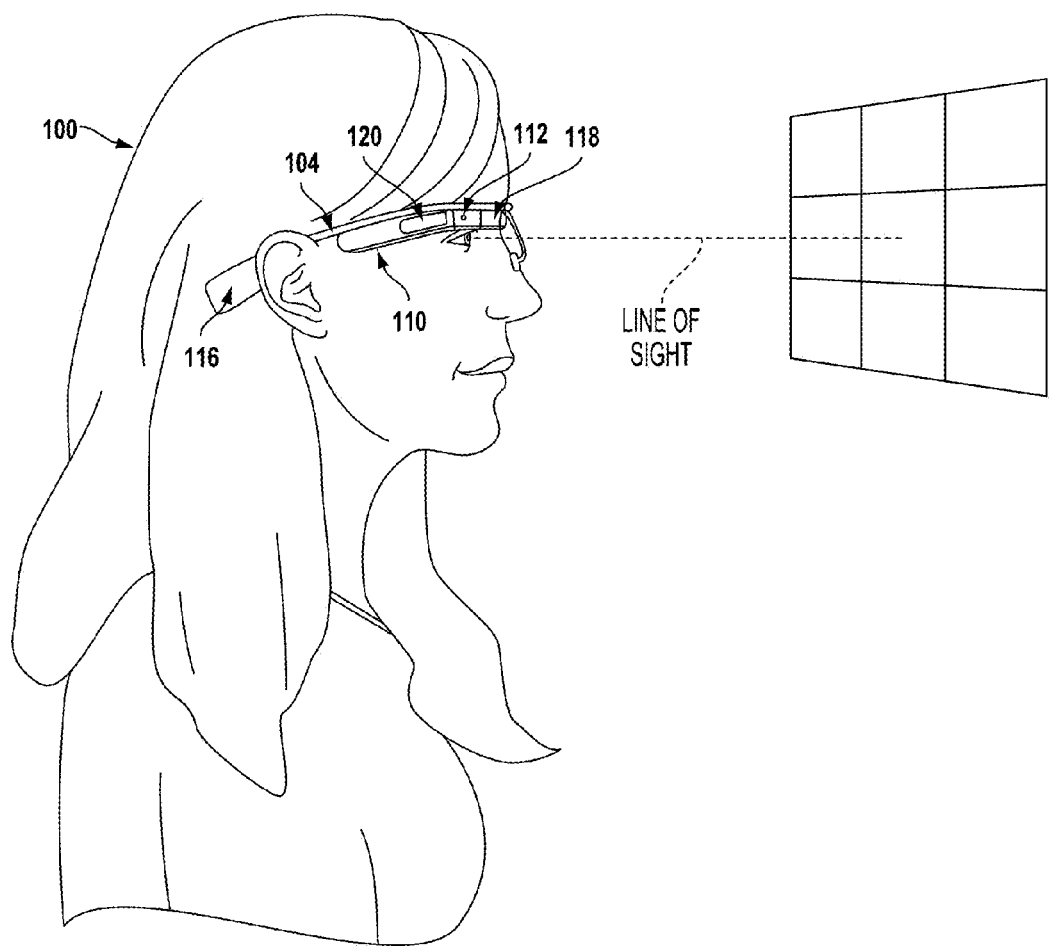
Figure 1D:
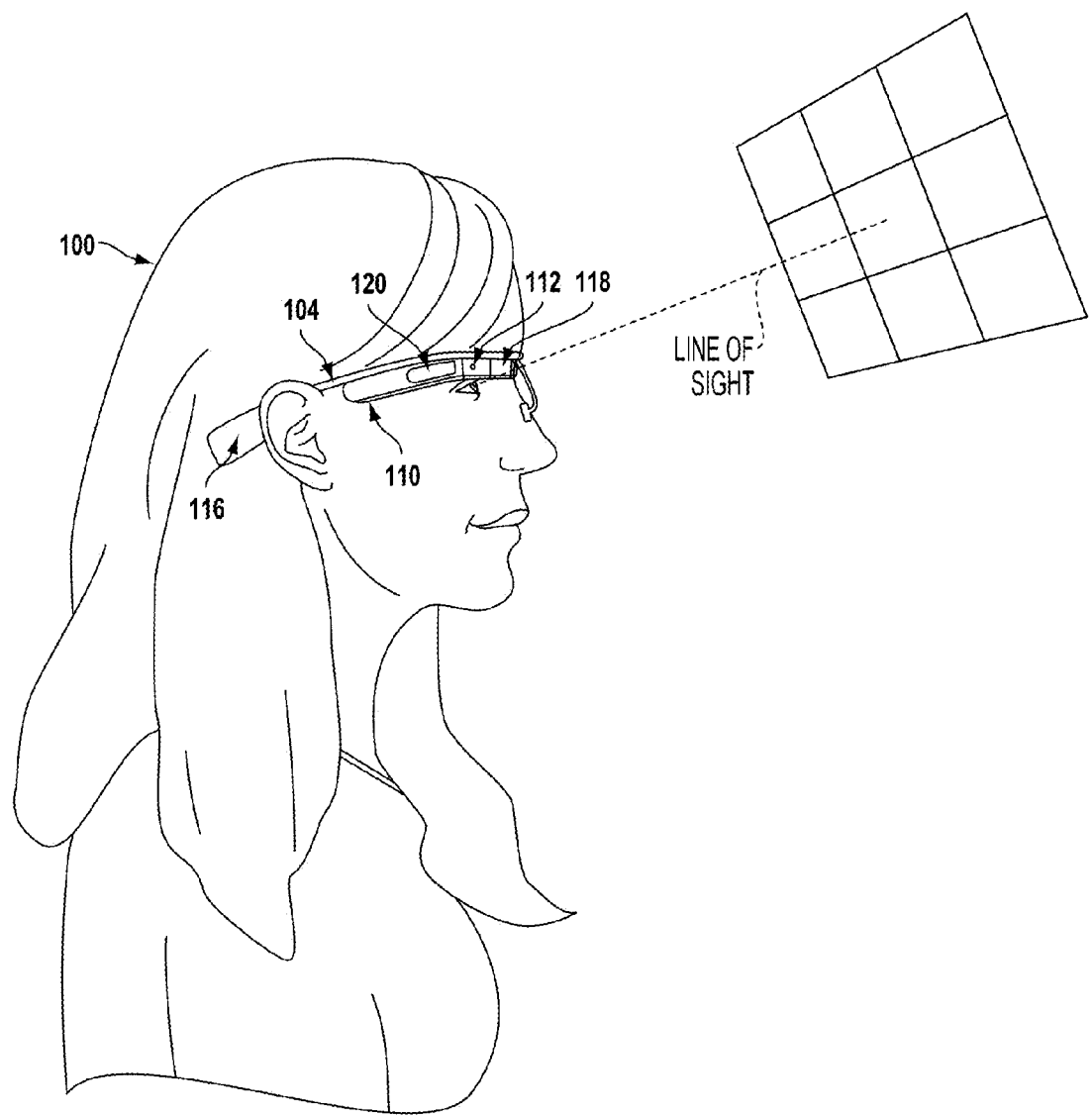

FIGS. 1B to 1D are simplified illustrations of the HMD 102 shown in FIG. 1A, being worn by a wearer 100. As shown in FIG. 1B, when HMD 102 is worn, BCT 116 is arranged such that when HMD 102 is worn, BCT 116 is located behind the wearer's ear. As such, BCT 116 is not visible from the perspective shown in FIG. 1B.

In the illustrated example, the display 118 may be arranged such that when HMD 102 is worn, display 118 is positioned in front of or proximate to a user's eye when the HMD 102 is worn by a user. For example, display 118 may be positioned below the center frame support and above the center of the wearer's eye, as shown in FIG. 1B. Further, in the illustrated configuration, display 118 may be offset from the center of the wearer's eye (e.g., so that the center of display 118 is positioned to the right and above of the center of the wearer's eye, from the wearer's perspective).

Configured as shown in FIGS. 1B to 1D, display 118 may be located in the periphery of the field of view of the wearer 100, when HMD 102 is worn. Thus, as shown by FIG. 1C, when the wearer 100 looks forward, the wearer 100 may see the display 118 with their peripheral vision. As a result, display 118 may be outside the central portion of the wearer's field of view when their eye is facing forward, as it commonly is for many day-to-day activities. Such positioning can facilitate unobstructed eye-to-eye conversations with others, as well as generally providing unobstructed viewing and perception of the world within the central portion of the wearer's field of view. Further, when the display 118 is located as shown, the wearer 100 may view the display 118 by, e.g., looking up with their eyes only (possibly without moving their head). This is illustrated as shown in FIG. 1D, where the wearer has moved their eyes to look up and align their line of sight with display 118. A wearer might also use the display by tilting their head down and aligning their eye with the display 118.

Figure 2:
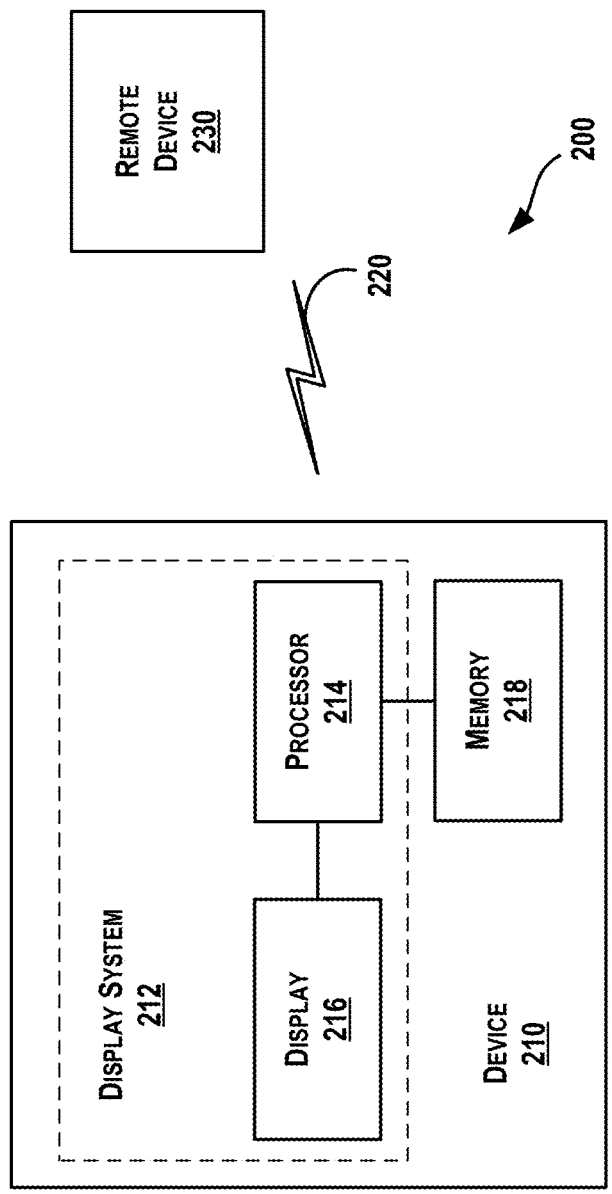
FIG. 2 is a simplified block diagram of a computing device according to an example embodiment.

FIG. 2 is a simplified block diagram a computing device 210 according to an example embodiment. In an example embodiment, device 210 communicates using a communication link 220 (e.g., a wired or wireless connection) to a remote device 230. The device 210 may be any type of device that can receive data and display information corresponding to or associated with the data. For example, the device 210 may take the form of or include a head-mountable display, such as the head-mounted device 102 that is described with reference to FIGS. 1A to 1D.

The device 210 may include a processor 214 and a display 216. The display 216 may be, for example, an optical see-through display, an optical see-around display, or a video see-through display. The processor 214 may receive data from the remote device 230, and configure the data for display on the display 216. The processor 214 may be any type of processor, such as a micro-processor or a digital signal processor, for example.

The device 210 may further include on-board data storage, such as memory 218 coupled to the processor 214. The memory 218 may store software that can be accessed and executed by the processor 214, for example.

The remote device 230 may be any type of computing device or transmitter including a laptop computer, a mobile telephone, head-mountable display, tablet computing device, etc., that is configured to transmit data to the device 210. The remote device 230 and the device 210 may contain hardware to enable the communication link 220, such as processors, transmitters, receivers, antennas, etc.

Further, remote device 230 may take the form of or be implemented in a computing system that is in communication with and configured to perform functions on behalf of client device, such as computing device 210. Such a remote device 230 may receive data from another computing device 210 (e.g., an HMD 102 or a mobile phone), perform certain processing functions on behalf of the device 210, and then send the resulting data back to device 210. This functionality may be referred to as "cloud" computing.

In FIG. 2, the communication link 220 is illustrated as a wireless connection; however, wired connections may also be used. For example, the communication link 220 may be a wired serial bus such as a universal serial bus or a parallel bus. A wired connection may be a proprietary connection as well. The communication link 220 may also be a wireless connection using, e.g., Bluetooth® radio technology, communication protocols described in IEEE 802.11 (including any IEEE 802.11 revisions), Cellular technology (such as GSM, CDMA, UMTS, EV-DO, WiMAX, or LTE), or Zigbee® technology, among other possibilities. The remote device 230 may be accessible via the Internet and may include a computing cluster associated with a particular web service (e.g., social-networking, photo sharing, address book, etc.).

III. EXAMPLE SYSTEMS

As described above, an example HMD may include a see-through display, which is made of glass and/or another transparent or translucent material, such that the wearer can see their environment through the display. The display may be arranged such that when the HMD is worn, the display is positioned in front of or proximate to a user's eye when the HMD is worn by the user. The display may include several glass plates that are bonded together to form a stack. These glass plates may be aligned at an angle to maximize the usage of the display. Therefore, a device to assist in bonding multiple glass plates or, more generally, wafers, may be desirable.

Figure 3A:
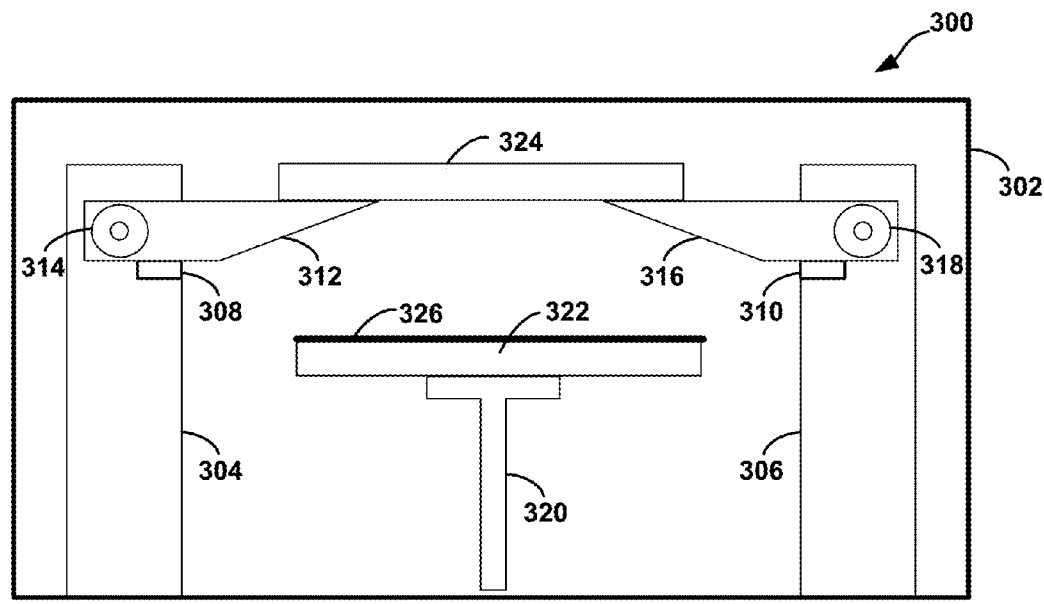
FIG. 3A illustrates an example system for bonding multiple wafers, according to an example embodiment.

FIG. 3A illustrates an example system 300 for bonding multiple wafers. The system 300 may include a sealable chamber 302. In one example, the sealable chamber 302 may be a glass chamber with a gate for loading and unloading wafers. The sealable chamber 302 may be configured such that a vacuum may be created inside of the sealable chamber 302 when the gate is closed. The system 300 may also include a first substantially vertical post 304 and a second substantially vertical post 306 positioned inside of the sealable chamber 302. The system 300 may further include a first stopper 308 fixed to the first post 304 and a second stopper 310 fixed to the second post 306.

The system 300 may also include a first latch 312 connected to the first post 304 via a first pin 314. The first pin 314 may be positioned at an end of the first latch 312. Further, the first pin 314 may be configured to allow the first latch 312 to rotate about the first pin 314. The first latch 312 may be positioned to rest on the first stopper 308 such that a top surface of the first latch 312 is substantially perpendicular to the first post 304. Similarly, the system 300 may include a second latch 316 connected to the second post 306 via a second pin 318. The second pin 318 may be positioned at an end of the second latch 316, and the second pin 318 may be configured to allow the second latch 316 to rotate about the second pin 318. The second latch 316 may be positioned to rest on the second stopper 310 such that a top surface of the second latch 316 is substantially perpendicular to the second post 306 and substantially level with the top surface of the first latch 312. In another example, the first and second pins 314, 318 may include a spring configured to bias the first and second latches 312, 316 such that the top surface of the first and second latches 312, 316 are substantially perpendicular to the first and second posts 304, 306.

The system 300 may further include a base plate 320 positioned between the first post 304 and the second post 306. In operation, a first wafer 322 may be positioned on the base plate 320 and a second wafer 324 may be positioned on the top surface of the first latch 312 and the top surface of the second latch 316. The first and second wafers may be positioned manually, or by an automated wafer loader and unloader. Further, an adhesive 326 may be applied to a top surface of the first wafer 322 prior to positioning the first wafer 322 on the base plate 320. The adhesive may be approximately 5-10 microns thick, although other thicknesses are possible as well.

Figure 3B:
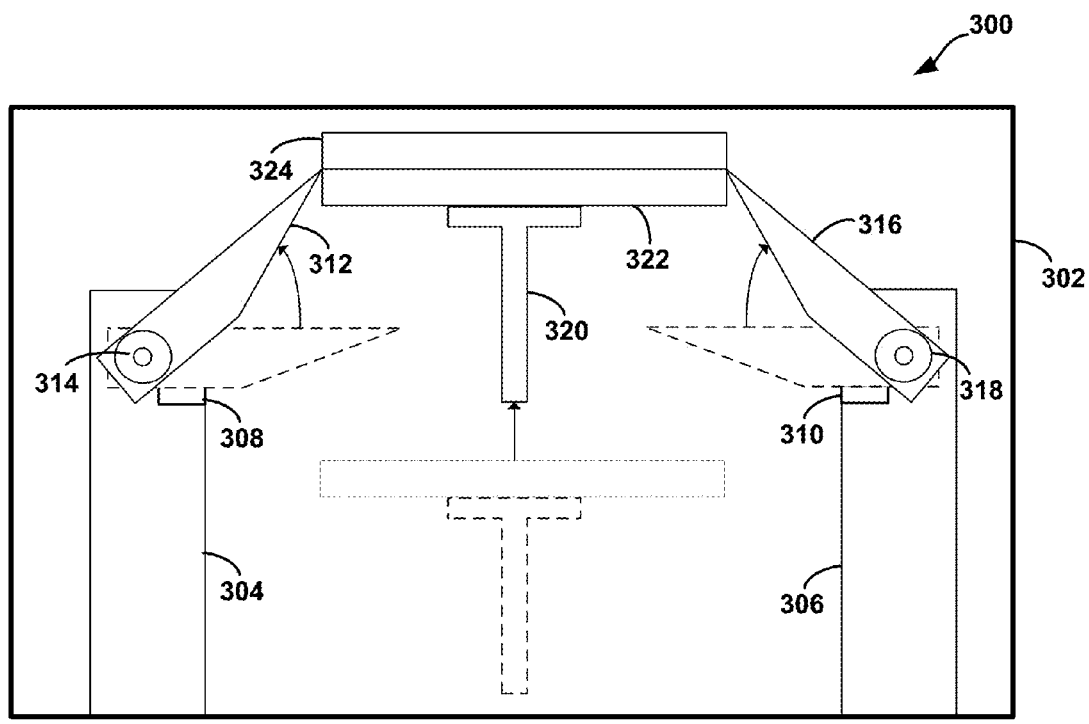
FIG. 3B illustrates an example system for bonding multiple wafers, according to an example embodiment.

FIG. 3B illustrates the example system 300 in operation. The base plate 320 may be configured to move from a first position below the first and second latches 312, 316 to a second position above the first and second latches 312, 316. The first position of the base plate 320 is represented in FIG. 3B by the dotted lines, while the second position of the base plate 320 is represented by the solid lines. As the base plate 320 moves from the first position to the second position, the first wafer 322 contacts the first and second latches 312, 316. The bottom surface of the first and second latches 312, 316 may be angled, as illustrated in FIGS. 3A-3B. When the base plate 320 lifts the first wafer 322 into the first and second latches 312, 316, the first and second laches 312, 316 rotate about the first and second pins 314, 318. The rotating first and second latches 312, 316 allow the first wafer 322 to contact and bond with the second wafer 324 that is positioned on the first and second latches 312, 316. Once the bonded first and second wafers 322, 324 rise above the first and second latches 312, 316, the first and second latches 312, 316 return to their original position, as shown by the dotted lines in FIG. 3B. Additional wafers and corresponding sets of latches may be added to the system 300 to allow for bonding of additional wafers to create a stack.

Figure 3D:
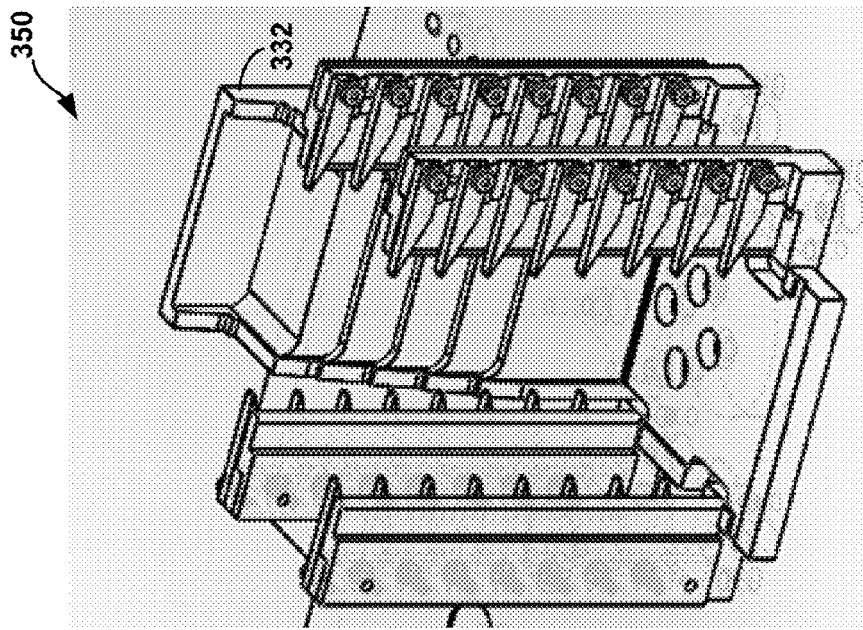
FIG. 3D illustrates an example system for bonding multiple wafers, according to an example embodiment.
Figure 3C:
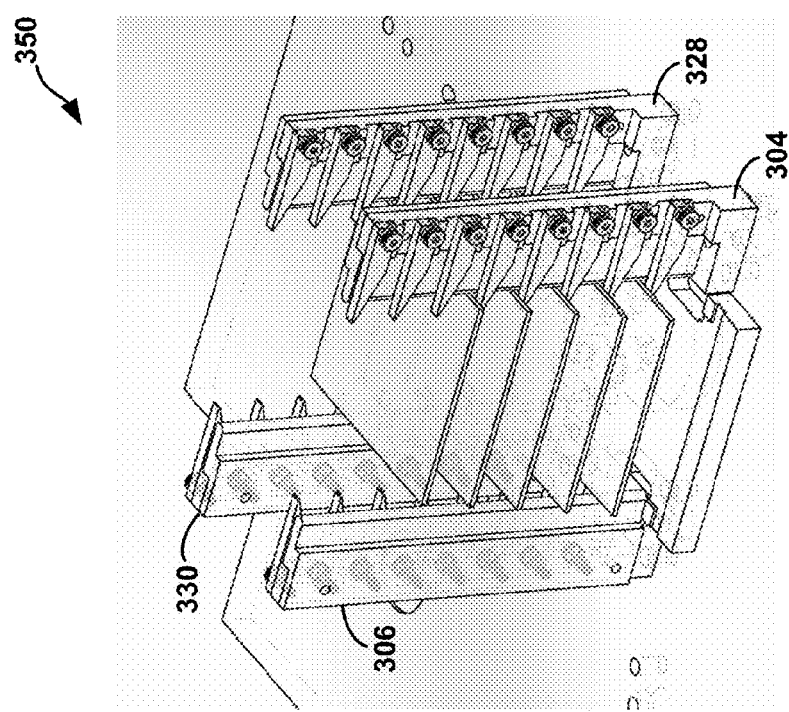
FIG. 3C illustrates an example system for bonding multiple wafers, according to an example embodiment.

FIG. 3C illustrates another example system 350 including a third post 328 and a fourth post 330. The system 350 illustrates a plurality of latches similar to the first and second latches 312, 316 described above in relation to FIGS. 3A-3B. In this particular example, the system 350 has eight sets of latches, with five wafers positioned on the sets of latches. Other arrangements are possible as well.

Figure 3E:
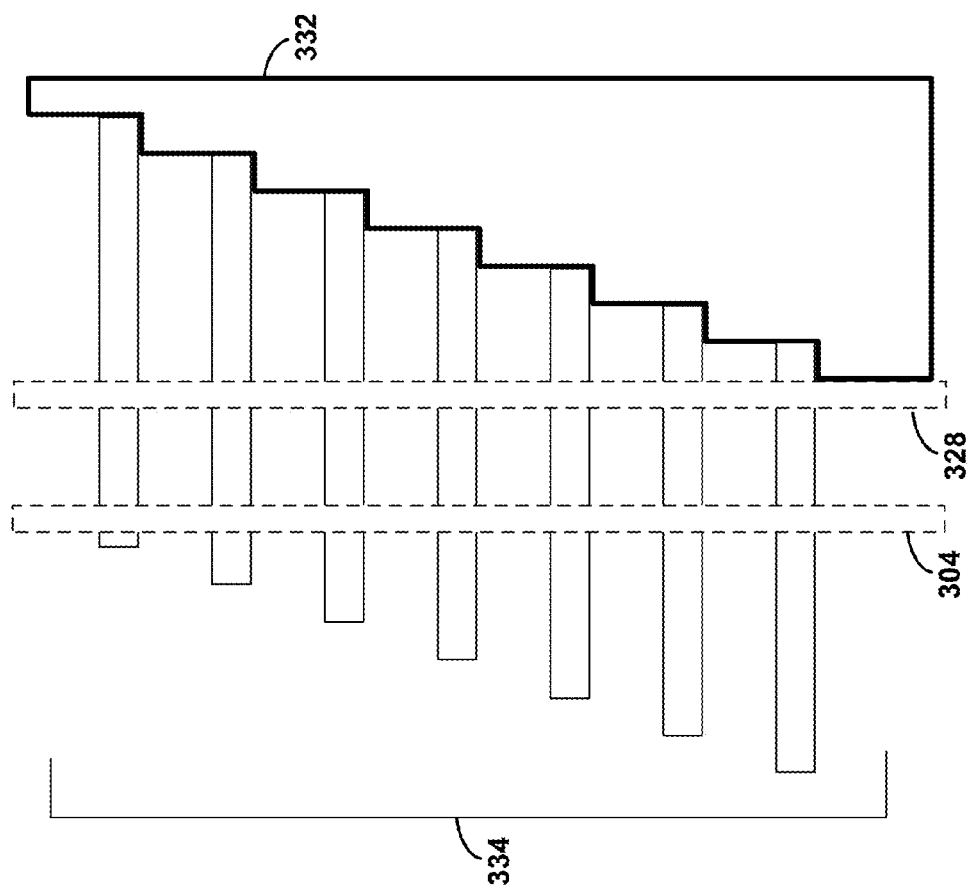
FIG. 3E illustrates an example alignment mechanism, according to an example embodiment.

FIG. 3D illustrates an alignment element 332 positioned adjacent to the sets of latches of the system 350. FIG. 3E further illustrates the alignment element 332 from a side view. The first post 304 and the third post 328 may contain a plurality of latches onto which a plurality of wafers 334 may be loaded. The alignment element 332 may include a staircase structure configured to position each of the plurality of wafers 334 at an offset to one another. As the plurality of wafers 334 are loaded onto the plurality of latches, each of the plurality of wafers 334 are positioned so that an end of the wafer abuts a surface of the alignment element 332. In this way, a desired offset angle between the plurality of wafers may be achieved.

Figure 3F:
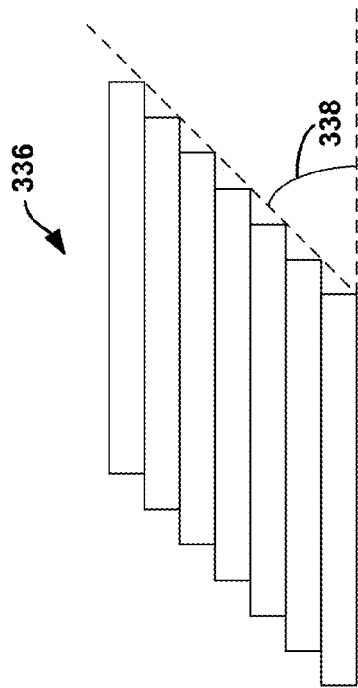
FIG. 3F illustrates a bonded stack of wafers, according to an example embodiment.

FIG. 3F illustrates a bonded stack 336 of wafers having an offset angle 338. In the example in FIGS. 3E-3F, each wafer is positioned with the same offset angle. However, in other embodiments, each wafer may be positioned with a unique offset angle with respect to the other wafers. Other alignment mechanisms are possible as well.

IV. EXAMPLE METHODS

Figure 4A:
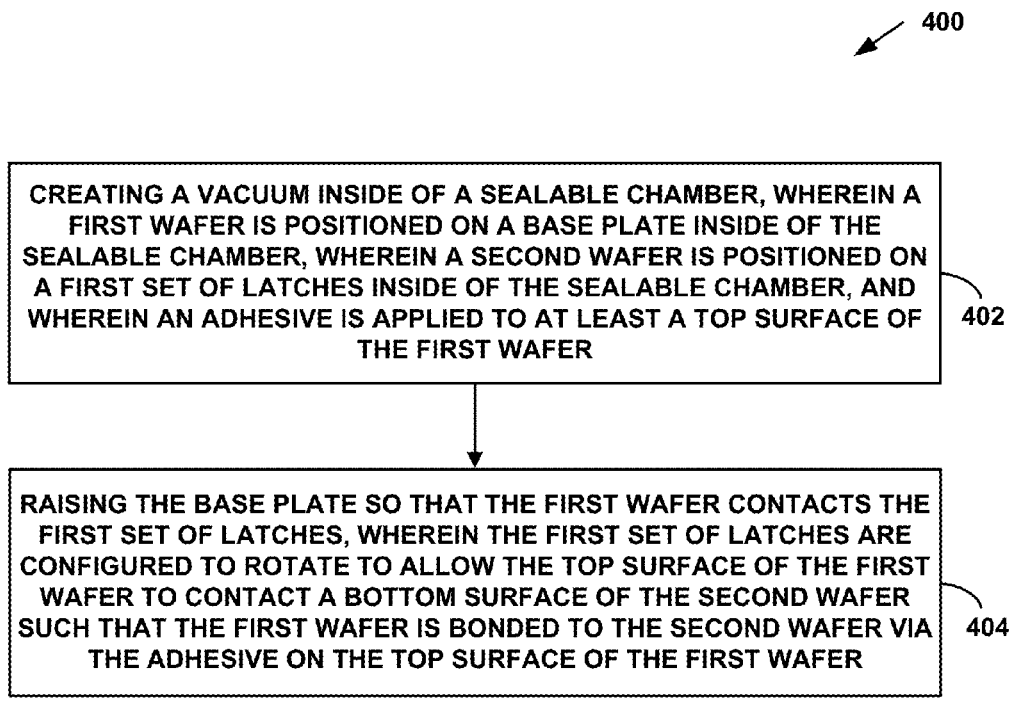
FIG. 4A is a flow chart illustrating a method, according to example embodiments.

FIG. 4A is a simplified flow chart illustrating method 400, according to an exemplary embodiment. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

At block 402, method 400 involves creating a vacuum inside of a sealable chamber, wherein a first wafer is positioned on a base plate inside of the sealable chamber, wherein a second wafer is positioned on a first set of latches inside of the sealable chamber, and wherein an adhesive is applied to at least a top surface of the first wafer. In one example, a user may position the first wafer on the base plate and the second wafer on the first set of latches. In another example, an automatic wafer loader and unloader may position the first wafer on the base plate and the second wafer on the first set of latches. The automatic wafer loader and unloader may by controlled by a robotics system, as an example. In another example, the first wafer may be initially positioned on the first set of latches. Other embodiments are possible as well.

Figure 4C:
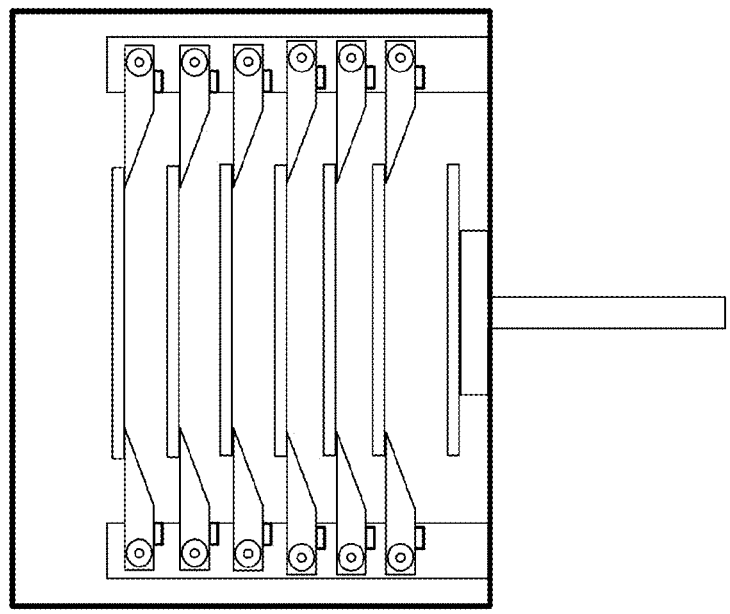
FIGS. 4B-4E illustrate the steps of the method described in FIG. 4A.
Figure 4B:
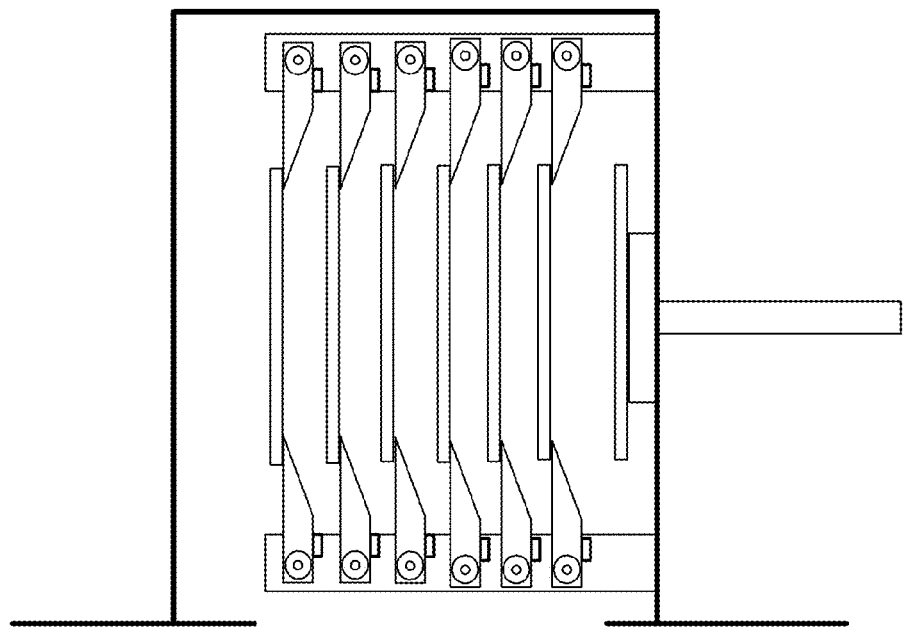

Additional wafers may be positioned on additional sets of latches. FIG. 4B illustrates an example system in accordance with method 400. As a specific example, the example system includes a base plate with a first wafer positioned thereon. The system also includes six sets of latches with six wafers positioned on the six sets of latches. The top surface of the bottom six wafers may be coated with an adhesive, as described above. The top wafer may not have any adhesive applied to its surfaces. In one example, an alignment element may be used to position the first, second and third wafers at a predetermined angle to one another. The alignment element may be may be similar to the alignment element 332 as described above in relation to FIGS. 3D-3E.

The sealable chamber may be a rigid enclosure from which air and other gases may be removed by a vacuum pump. The sealable chamber may include a gate that can be opened during the loading and unloading of the wafers. Once the gate is closed, the vacuum pump may remove the gases from the sealable chamber. The vacuum environment of the sealable chamber may help prevent bubbles from forming between the bonded wafers. FIG. 4B illustrates an example gate that is opened during the loading of the wafers, and FIG. 4C illustrates the sealed chamber in which a vacuum is created.

The adhesive applied to the top surface of the first wafer may generally include monomers or oligomers that can be cured thermally, or by UV or visible light. Additionally, thermoplastic adhesives can be utilized that are heated and the adhesion is set in upon cooling of the wafers.

In some embodiments, the adhesive may be spray coated onto the top surface of the first and second wafers using a nebulizer. The nebulizer may be configured to spray the adhesive having a thickness of 5-10 microns, although other thicknesses are possible as well.

In other embodiments, the adhesive may be stamped onto the first and second wafers using a polydimethylsiloxane (PDMS) stamp. For example, a pad containing the adhesive may be stamped by the PDMS stamp, thereby transferring a small amount of adhesive from the pad to the PDMS stamp. The PDMS stamp containing the adhesive may then be stamped on the top surface of the first and second wafers, thereby transferring a thin layer of adhesive to the first and second wafers.

In yet other embodiments, the adhesive may be brushed onto the top surface of the first and second wafers. Other techniques, such as spin-coating and slit coating for applying adhesive to a wafer are possible as well.

Figure 4E:
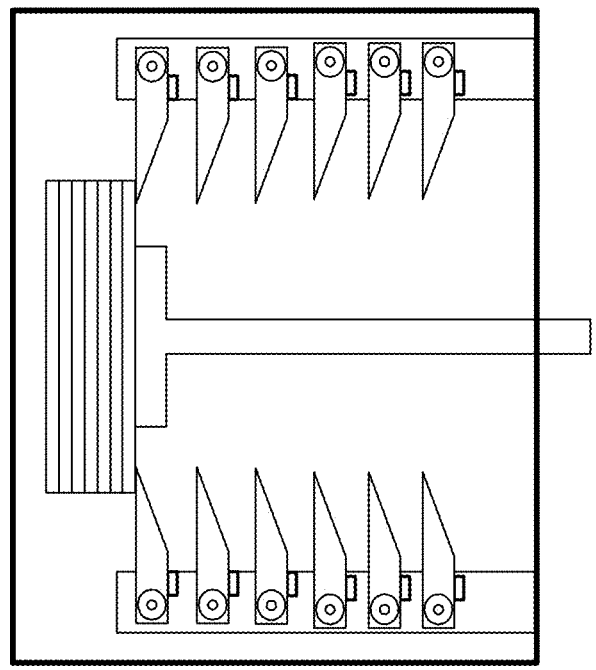
Figure 4D:
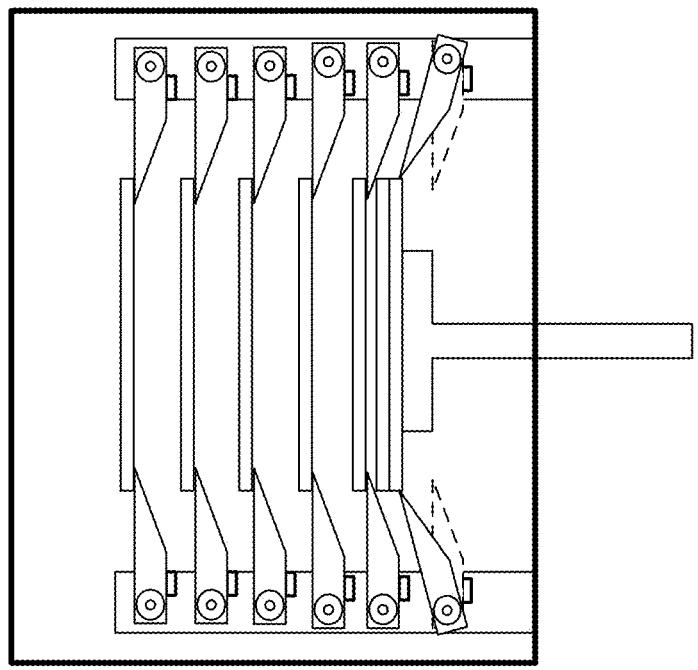

At block 404, method 400 includes raising the base plate so that the first wafer contacts the first set of latches. The first set of latches are configured to rotate or otherwise retract, as discussed above in relation to FIGS. 3A-3B. As the first set of latches rotate or retract, the adhesive applied to the top surface of the first wafer contacts a bottom surface of the second wafer, thereby allowing the top surface of the first wafer to bond with the bottom surface of the second wafer. As the base plate rises above the first set of latches, the first set of latches return to their original position. FIG. 4D illustrates the bonded first and second wafers contacting the first set of latches.

Additional sets of latches may be added to the system, and each set of latches may be configured to rotate or retract, as discussed above in relation to FIGS. 3A-3B. As discussed above, additional wafers may be positioned on the additional sets of latches to create a stack of bonded wafers. FIG. 4E illustrates a bonded stack of seven wafers. In one embodiment, once all of the wafers of bonded together, the base plate may be raised such that the bonded wafers contact the ceiling of the sealable chamber to provide an additional bonding force on the wafers. Other embodiments are possible as well.

Figure 5A:
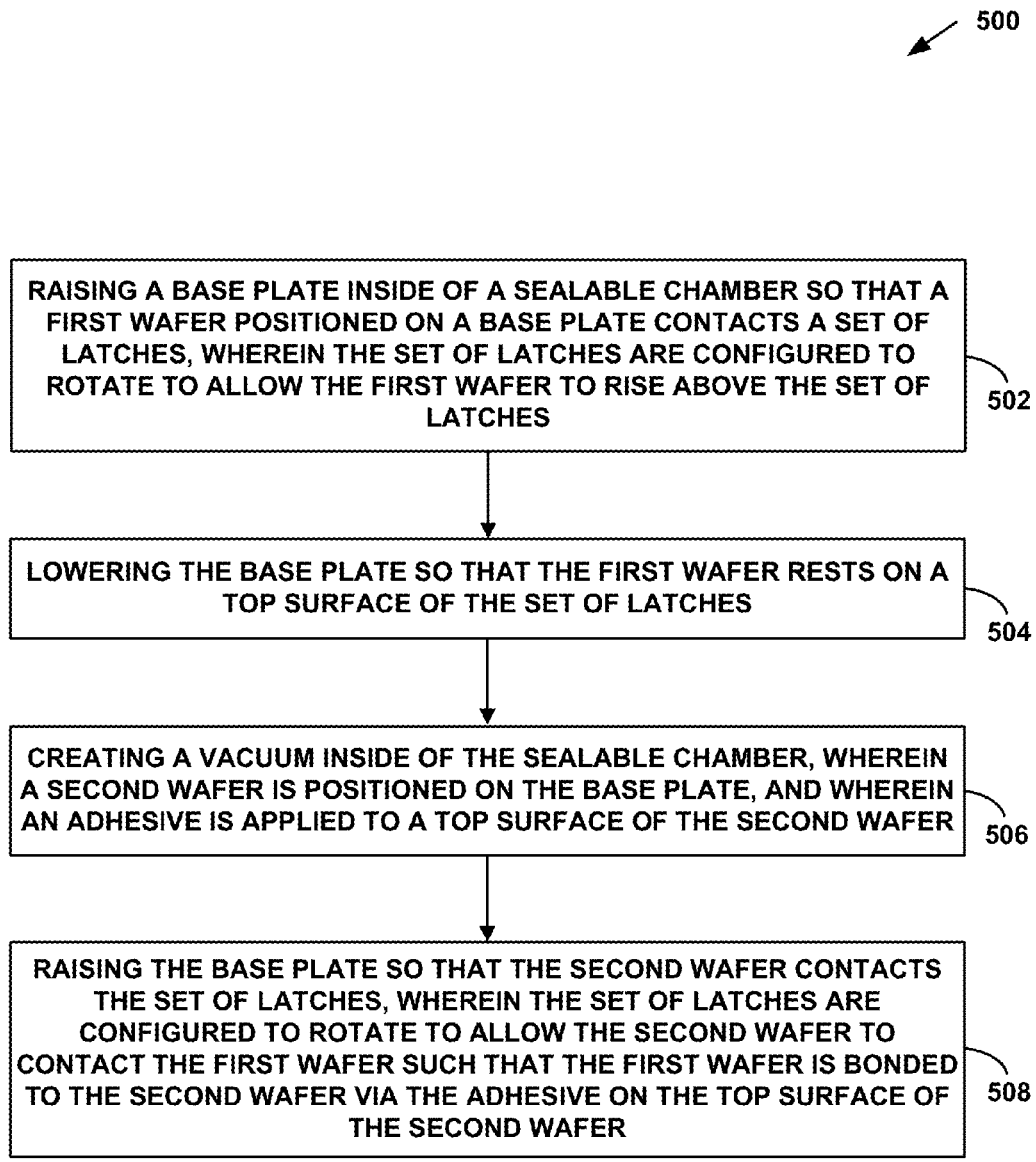
FIG. 5A is a flow chart illustrating another method, according to example embodiments.

FIG. 5A is a simplified flow chart illustrating method 500, according to an exemplary embodiment. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

Figure 5C:
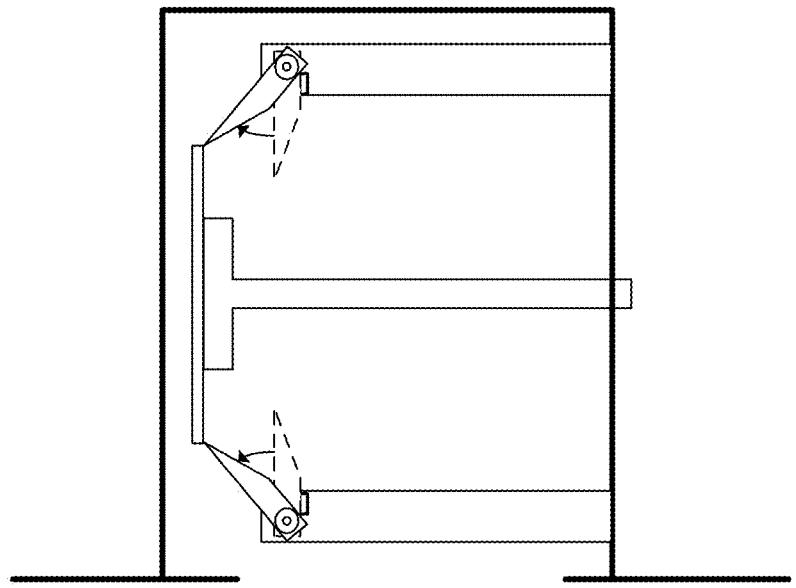
FIGS. 5B-5G illustrate the steps of the method described in FIG. 5A.
Figure 5B:
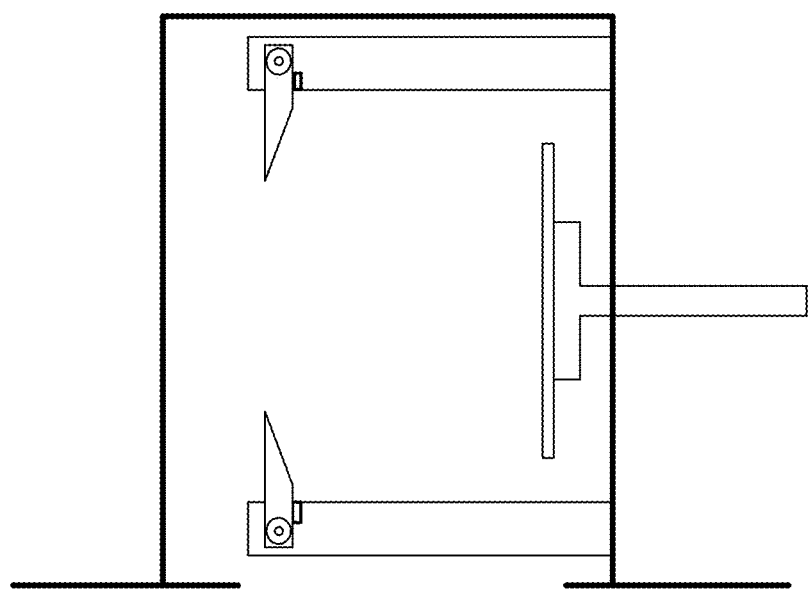

At block 502, method 500 involves raising a base plate inside of a sealable chamber so that a first wafer positioned on a base plate contacts a set of latches, wherein the set of latches are configured to rotate or retract to allow the first wafer to rise above the set of latches. As discussed above, a user may position the first wafer on the base plate. In another example, an automatic wafer loader and unloader may position the first wafer on the base plate. The automatic wafer loader and unloader may by controlled by a robotics system, as an example. FIG. 5B illustrates the first wafer positioned on the base plate in accordance with an example embodiment. In another example, the first wafer may be initially positioned on the set of latches.

The set of latches are configured to rotate or retract to allow the first wafer to rise above the set of latches. The set of latches may be configured similar to the set of latches discussed in more detail in relation to FIGS. 3A-3B. FIG. 5C illustrates the first wafer contacting the set of latches. As shown, the set of latches are configured to rotate freely or otherwise retract to allow the first wafer to rise above the set of latches. Once the first wafer rises above the set of latches, the latches return to their original position.

At block 504, method 500 involves lowering the base plate so that the first wafer rests on a top surface of the set of latches. The base plate is configured such that it passes between the set of latches without contacting the latches as the base plate is lowered.

Figure 5E:
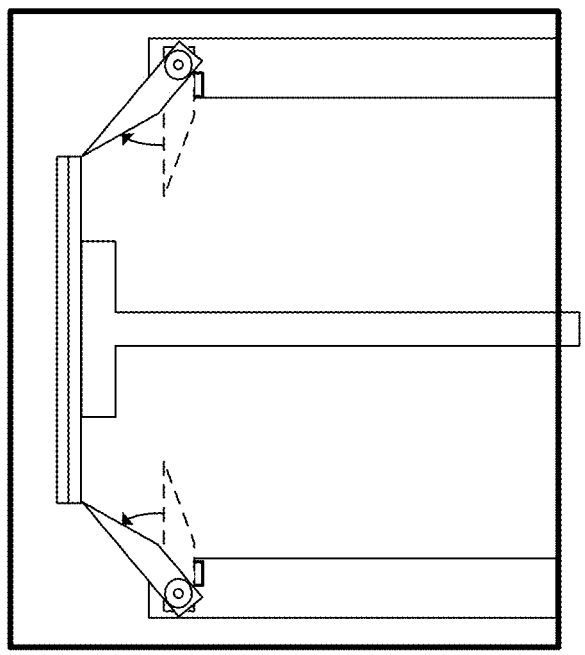
Figure 5D:
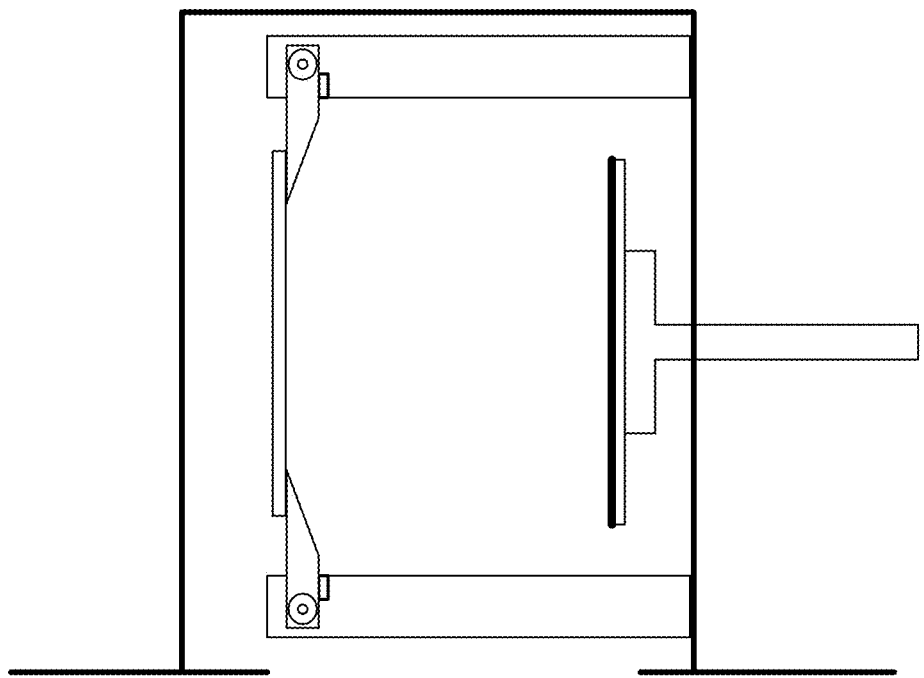

At block 506, method 500 involves creating a vacuum inside of the sealable chamber, wherein a second wafer is positioned on the base plate, and wherein an adhesive is applied to a top surface of the second wafer. A user may position the second wafer on the base plate. In another example, an automatic wafer loader and unloader may position the second wafer on the base plate. The automatic wafer loader and unloader may by controlled by a robotics system, as an example. FIG. 5D illustrates the first wafer positioned on the set of latches, and the second wafer coated with an adhesive on its top surface and positioned on the base plate in accordance with an example embodiment.

As discussed above, the sealable chamber may be a rigid enclosure from which air and other gases may be removed by a vacuum pump. The sealable chamber may include a gate that can be opened during the loading and unloading of the wafers. Once the gate is closed, the vacuum pump may remove the gases from the sealable chamber. The vacuum environment of the sealable chamber may help prevent bubbles from forming between the bonded wafers. FIG. 5D illustrates an example gate that is opened during the loading of the wafers, and FIG. 5E illustrates the sealed chamber in which a vacuum is created.

Further, an adhesive is applied to the top surface of the second wafer. As discussed above, a wide variety of adhesives may be utilized and generally include monomers or oligomers that can be cured thermally, or by UV or visible light. Additionally, thermoplastic adhesives can be utilized that are heated and the adhesion is set in upon cooling of the wafers. In one example, the adhesive may be spray coated onto the top surface of the second wafer using a nebulizer. The nebulizer may be configured to spray the adhesive having a thickness of 5-10 microns, although other thicknesses are possible as well. In another example, the adhesive may be stamped onto the second wafer using a polydimethylsiloxane (PDMS) stamp. In one example, a pad containing the adhesive may be stamped by the PDMS stamp, thereby transferring a small amount of adhesive from the pad to the PDMS stamp. The PDMS stamp containing the adhesive may then be stamped on the top surface of the second wafer, thereby transferring a thin layer of adhesive to the second wafer. In yet another example, the adhesive may be brushed onto the top surface of the second wafer. Other embodiments are possible as well.

At block 508, method 500 involves raising the base plate so that the second wafer contacts the set of latches. The set of latches are configured to allow the second wafer to contact the first wafer such that the first wafer is bonded to the second wafer via the adhesive on the top surface of the second wafer. FIG. 5E illustrates the second wafer contacting the set of latches. As shown, the set of latches are configured to rotate freely or otherwise retract to allow the bonded first and second wafers to rise above the set of latches. Once the bonded first and second wafers rise above the set of latches, the latches return to their original position.

Figure 5G:
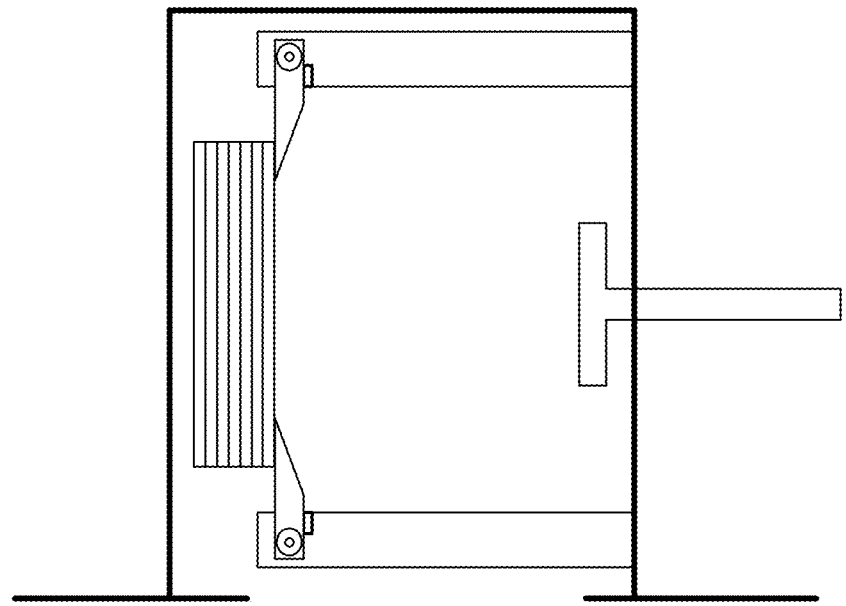
Figure 5F:
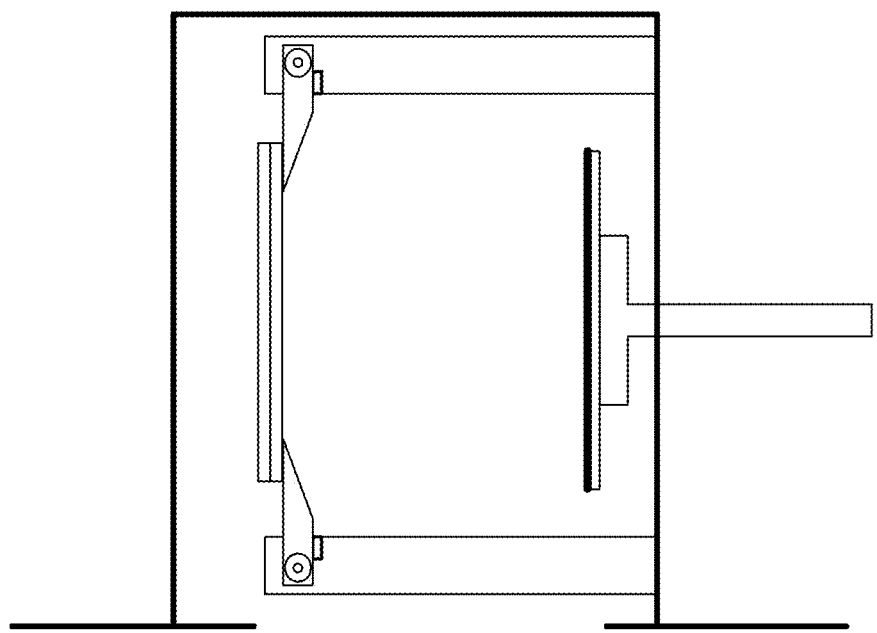

Additional wafers may be positioned on the base plate and raised into the bonded first and second wafers to create a stack of bonded wafers. In such an example, the method 500 may further include venting the sealable chamber after the first wafer is bonded to the second wafer. The method 500 may then include creating a vacuum inside of the sealable chamber, wherein a third wafer is positioned on the base plate, and wherein an adhesive is applied to a top surface of the third wafer. The method 500 may then include raising the base plate so that the third wafer contacts the set of latches. The set of latches are configured to allow the third wafer to contact the bonded first and second wafers such that the bonded first and second wafers are bonded to the third wafer via the adhesive on the top surface of the third wafer. Additional wafers may be bonded in a similar manner to create a stack using the just described method for each additional wafer. FIG. 5G illustrates a bonded stack of seven wafers. In one embodiment, once all of the wafers of bonded together, the base plate may be raised such that the bonded wafers contact the ceiling of the sealable chamber to provide an additional bonding force on the wafers. Other embodiments are possible as well.

V. EXAMPLE COMPUTER-READABLE MEDIUM CONFIGURED TO BOND MULTIPLE WAFERS

Figure 6:
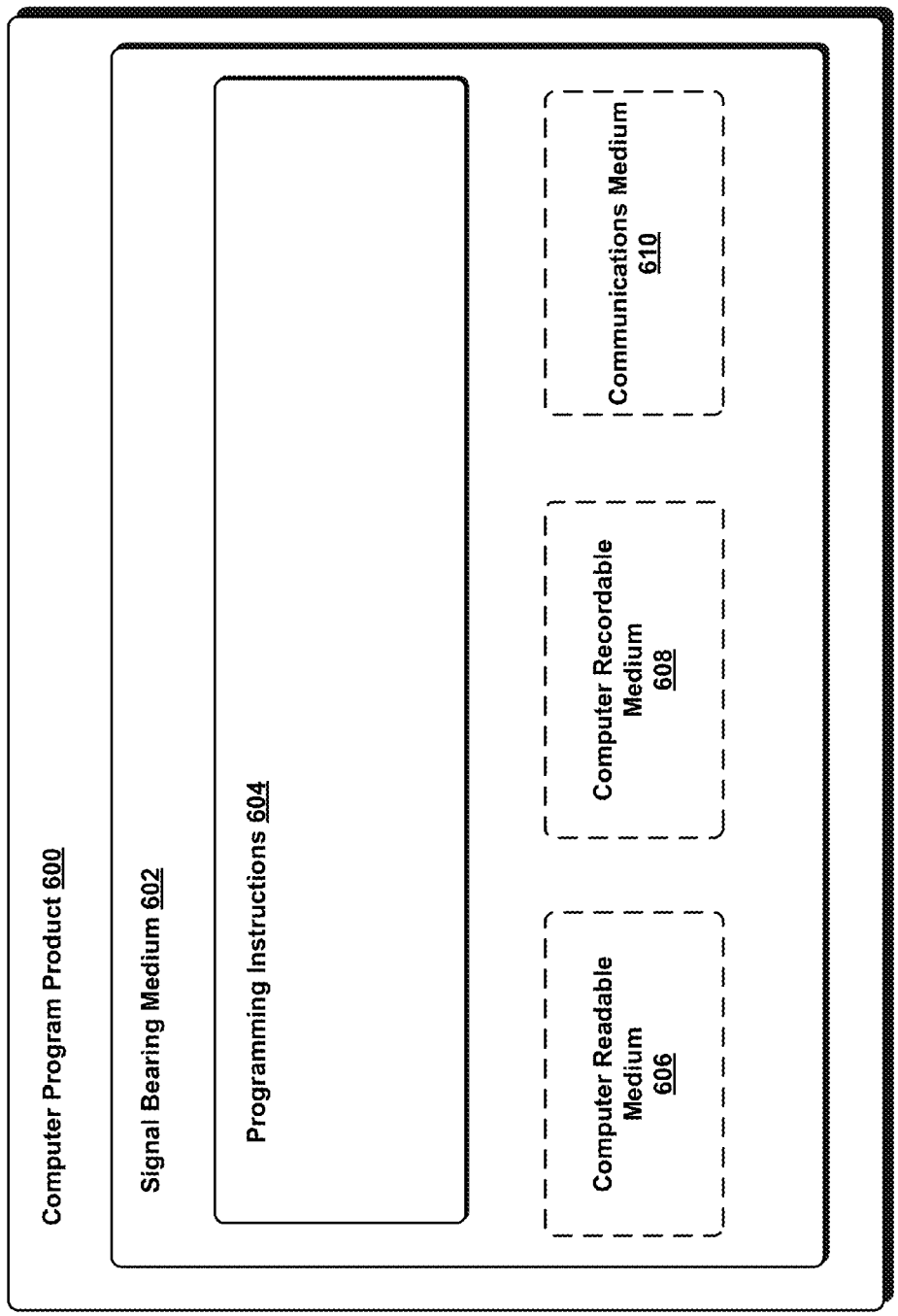
FIG. 6 depicts a computer-readable medium configured according to an example embodiment.

FIG. 6 depicts a computer-readable medium configured according to an example embodiment. In example embodiments, the example system can include one or more processors, one or more forms of memory, one or more input devices/interfaces, one or more output devices/interfaces, and machine-readable instructions that when executed by the one or more processors cause the system to carry out the various functions, tasks, capabilities, etc., described above.

As noted above, in some embodiments, the disclosed methods can be implemented by computer program instructions encoded on a non-transitory computer-readable storage media in a machine-readable format, or on other non-transitory media or articles of manufacture. FIG. 6 is a schematic illustrating a conceptual partial view of an example computer program product that includes a computer program for executing a computer process on a computing device, arranged according to at least some embodiments presented herein.

In one embodiment, the example computer program product 600 is provided using a signal bearing medium 602. The signal bearing medium 602 may include one or more programming instructions 604 that, when executed by one or more processors may provide functionality or portions of the functionality described above with respect to FIGS. 1-5B. In some examples, the signal bearing medium 602 can be a computer-readable medium 606, such as, but not limited to, a hard disk drive, a Compact Disc (CD), a Digital Video Disk (DVD), a digital tape, memory, etc. In some implementations, the signal bearing medium 602 can be a computer recordable medium 608, such as, but not limited to, memory, read/write (R/W) CDs, R/W DVDs, etc. In some implementations, the signal bearing medium 602 can be a communications medium 610, such as, but not limited to, a digital and/or an analog communication medium (e.g., a fiber optic cable, a waveguide, a wired communications link, a wireless communication link, etc.). Thus, for example, the signal bearing medium 602 can be conveyed by a wireless form of the communications medium 610.

The one or more programming instructions 604 can be, for example, computer executable and/or logic implemented instructions. In some examples, a computing device is configured to provide various operations, functions, or actions in response to the programming instructions 604 conveyed to the processor by one or more of the computer-readable medium 606, the computer recordable medium 608, and/or the communications medium 610.

VI. CONCLUSION

It should be understood that arrangements described herein are for purposes of example only. As such, those skilled in the art will appreciate that other arrangements and other elements (e.g., machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims, along with the full scope of equivalents to which such claims are entitled. It is also to be understood that the terminology used herein is for the purpose of describing particular embodiments only, and is not intended to be limiting.

We claim:
1. A system comprising:
   a sealable chamber;

a first substantially vertical post and a second substantially vertical post positioned inside of the sealable chamber;

a first stopper fixed to the first post and a second stopper fixed to the second post;

a first latch connected to the first post via a first pin, wherein the first pin allows the first latch to rotate about the first pin;

a second latch connected to the second post via a second pin, wherein the second pin allows the second latch to rotate about the second pin; and a base plate positioned between the first and second posts, wherein the base plate is configured to move upwards from a first position below the first and second latches to a second position above the first and second latches, and wherein the base plate is arranged such that when a first wafer rests on the base plate and a second wafer rests on the first and second latches, moving the base plate from the first position to the second position causes a top surface of the first wafer to contact a bottom surface of the second wafer.

2. The system of claim 1, wherein the first latch is positioned to rest on the first stopper such that a top surface of the first latch is substantially perpendicular to the first post, and wherein the second latch is positioned to rest on the second stopper such that a top surface of the second latch is substantially perpendicular to the second post and substantially level with the top surface of the first latch.

3. The system of claim 1, wherein moving the base plate from the first position to the second position causes the first wafer to contact a bottom surface of the first and second latches, and wherein the contacted first and second latches are configured to rotate about the first and second pins enabling the wafer to rise above the first and second latches.

4. The system of claim 1, wherein the first and second latches include an angled bottom surface.

5. The system of claim 1, wherein the first and second pins include a spring configured to bias the first and second latches such that the top surface of the first and second latches are substantially perpendicular to the first and second posts.

6. The system of claim 1, further comprising an automatic wafer loader and unloader.

7. The system of claim 1, further comprising:
a third stopper fixed to the first post and a fourth stopper fixed to the second post;
a third latch connected to the first post via a third pin positioned above the first latch, wherein the third pin allows the third latch to rotate about the third pin, and wherein the third latch is positioned to rest on the third stopper such that a top surface of the third latch is substantially perpendicular to the first post; and
a fourth latch connected to the second post via a fourth pin positioned above the second latch, wherein the fourth pin allows the fourth latch to rotate about the fourth pin, and wherein the fourth latch is positioned to rest on the fourth stopper such that a top surface of the fourth latch is substantially perpendicular to the second post and substantially level with a top surface of the third latch.

8. The system of claim 7, wherein a third wafer is configured to rest on the top surface of the third latch and the top surface of the fourth latch.

9. The system of claim 1, further comprising:
a third substantially vertical post located inside of the sealable chamber;
a third stopper fixed to the third post; and
a third latch connected to the third post via a third pin, wherein the third pin allows the third latch to rotate about the third pin, and wherein the third latch is positioned to rest on the third stopper such that a top surface of the third latch is substantially perpendicular to the third post and substantially level with the top surface of the first latch.

10. The system of claim 9, further comprising:
a fourth substantially vertical post located inside of the sealable chamber;
a fourth stopper fixed to the fourth post; and
a fourth latch connected to the fourth post via a fourth pin, wherein the fourth pin allows the fourth latch to rotate about the fourth pin, and wherein the fourth latch is positioned to rest on the fourth stopper such that a top surface of the fourth latch is substantially perpendicular to the fourth post and substantially level with the top surface of the third latch.

11. The system of claim 10, wherein the first, second, third and fourth latches comprise a first set of latches, wherein the device further comprises a plurality of sets of latches configured to hold a plurality of wafers.

* * * * *